United States Patent
Vu et al.

(10) Patent No.: US 6,949,934 B1
(45) Date of Patent: Sep. 27, 2005

(54) FAULT-ANNUCIATING SYSTEM FOR A TRANSFORMER

(75) Inventors: Tri D. Vu, Apex, NC (US); Joseph Oravsky, Clayton, NC (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 10/431,286

(22) Filed: May 7, 2003

(51) Int. Cl.$^7$ .......................... G01R 31/06; G01R 29/20
(52) U.S. Cl. ...................... 324/547; 324/726
(58) Field of Search ................ 324/547, 726, 324/55, 127, 511; 340/646

(56) References Cited

U.S. PATENT DOCUMENTS

| | | | |
|---|---|---|---|
| 3,936,699 A | 2/1976 | Adams | 317/18 |
| 4,024,436 A | 5/1977 | Adams | 361/45 |
| 4,060,803 A | 11/1977 | Ashworth, Jr. | 340/409 |
| 4,097,852 A * | 6/1978 | Usry | 340/626 |
| 4,249,170 A | 2/1981 | Cham et al. | 340/646 |
| 4,291,204 A | 9/1981 | Crick | 179/175.3 |
| 4,445,457 A * | 5/1984 | Bargman | 116/268 |
| 4,654,806 A * | 3/1987 | Poyser et al. | 700/292 |
| 4,755,805 A | 7/1988 | Chau | 340/662 |
| 5,534,853 A * | 7/1996 | Pioch | 340/646 |
| 6,429,662 B1 * | 8/2002 | Cuk et al. | 324/547 |

FOREIGN PATENT DOCUMENTS

| | | |
|---|---|---|
| EP | 0 072 882 A1 | 3/1983 |
| EP | 0 253 447 A1 | 1/1988 |
| EP | 0 448 619 B1 | 10/1991 |

OTHER PUBLICATIONS

"Single Phase Overhead Distribution Transformers", *ABB, Inc., Distribution Transformers, Athens, GA, Jefferson City, MO.*, Jan. 2002, 2 Pages.

* cited by examiner

Primary Examiner—Vincent Q. Nguyen
Assistant Examiner—Amy He
(74) Attorney, Agent, or Firm—Woodcock Washburn LLP

(57) ABSTRACT

A preferred embodiment of a transformer includes a core, and a primary and a secondary winding positioned on the core so that the primary and secondary windings are inductively coupled when the primary winding is energized. The transformer also includes a sensor for measuring an operating parameter of the transformer, an audible signaling device, and an actuator for activating the audible signaling device when the operating parameter reaches a predetermined value.

28 Claims, 5 Drawing Sheets

FAULT-ANNUCIATING SYSTEM FOR A TRANSFORMER

FIELD OF THE INVENTION

The present invention relates generally to transformers and, more specifically, to a fault-annunciating system that provides an audible indication of a transformer fault.

BACKGROUND OF THE INVENTION

Distribution transformers are often equipped with some type of internal fault detector for providing a visual indication that a fault has occurred in the transformer. For example, one commonly-used type of internal fault detector senses the temperature or pressure at one or more locations within the transformer. (A substantial increase in the operating temperature or pressure of transformer is usually indicative of a fault therein.) The internal fault detector causes some type of mechanical component, such as a pole, to extend upward from the top of the transformer when the monitored temperature or pressure exceeds a predetermined value. The extended pole functions as a visual indication that the transformer has experienced a fault.

A faulty transformer typically results in a power outage or other anomaly in the vicinity of the transformer. A repair crew from the utility company is usually dispatched to the affected area to locate and repair the faulty transformer. The repair crew visually scans the various transformers in the area until the repair crew sights the visual fault indication, i.e., the extended pole, on the faulty transformer. The faulty transformer, having thus been located, can thereafter be repaired.

The use of a visual indication to identify a faulty transformer has certain drawbacks. For example, a repair crew attempting to locate a faulty pole-mounted transformer can experience muscle strain or fatigue from repeatedly looking upward at a relatively steep angle for the fault indication. Moreover, the need to visually scan for a fault indication can distract the driver of the vehicle carrying the repair crew, thereby creating a safety hazard. Also, a visual fault indication sometimes cannot be seen from certain perspectives, especially on pole-mounted transformers.

A visual fault indication also can be difficult or impossible to see at night and under adverse weather conditions, e.g., fog or heavy rain. Furthermore, a visual indication, in general, can only be detected when the repair crew is in relatively close proximity of the transformer, i.e., when the faulty transformer is within sight of the repair crew.

SUMMARY OF THE INVENTION

A preferred embodiment of a transformer comprises a core, and a primary and a secondary winding positioned on the core so that the primary and secondary windings are inductively coupled when the primary winding is energized. The transformer also comprises a sensor for measuring an operating parameter of the transformer, an audible signaling device, and an actuator for activating the audible signaling device when the operating parameter reaches a predetermined value.

Another preferred embodiment of a transformer comprises a core, a primary and a secondary winding positioned on the core, and an audible signaling device responsive to the occurrence of a fault in the transformer.

Another preferred embodiment of a transformer comprises a core, a primary winding positioned around a first winding leg of the core, and a secondary winding positioned around one of the first winding leg and a second winding leg of the core. The transformer also comprises a casing for housing the core and the primary and secondary windings, and a cover for the casing.

The transformer further comprises an audible signaling device mounted on one of the casing and the cover. The transformer comprises whistle, a pressure regulator, and a canister for holding a pressurized fluid. The transformer also comprises a sensor for measuring an operating parameter of the transformer, and an actuator for causing the pressure regulator to permit the pressurized fluid to flow from the canister to the whistle when the operating parameter reaches a predetermined value.

A preferred method for locating a faulty transformer in an area of a power outage comprises moving to within audible range of an audible signaling device of each of a plurality of transformers in the area, and listening for an audible fault indication produced by the audible signaling device of the faulty transformer.

BRIEF DESCRIPTION OF THE DRAWINGS

The foregoing summary, as well as the following detailed description of a preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PREFERRED EMBODIMENTS

Figure 1:
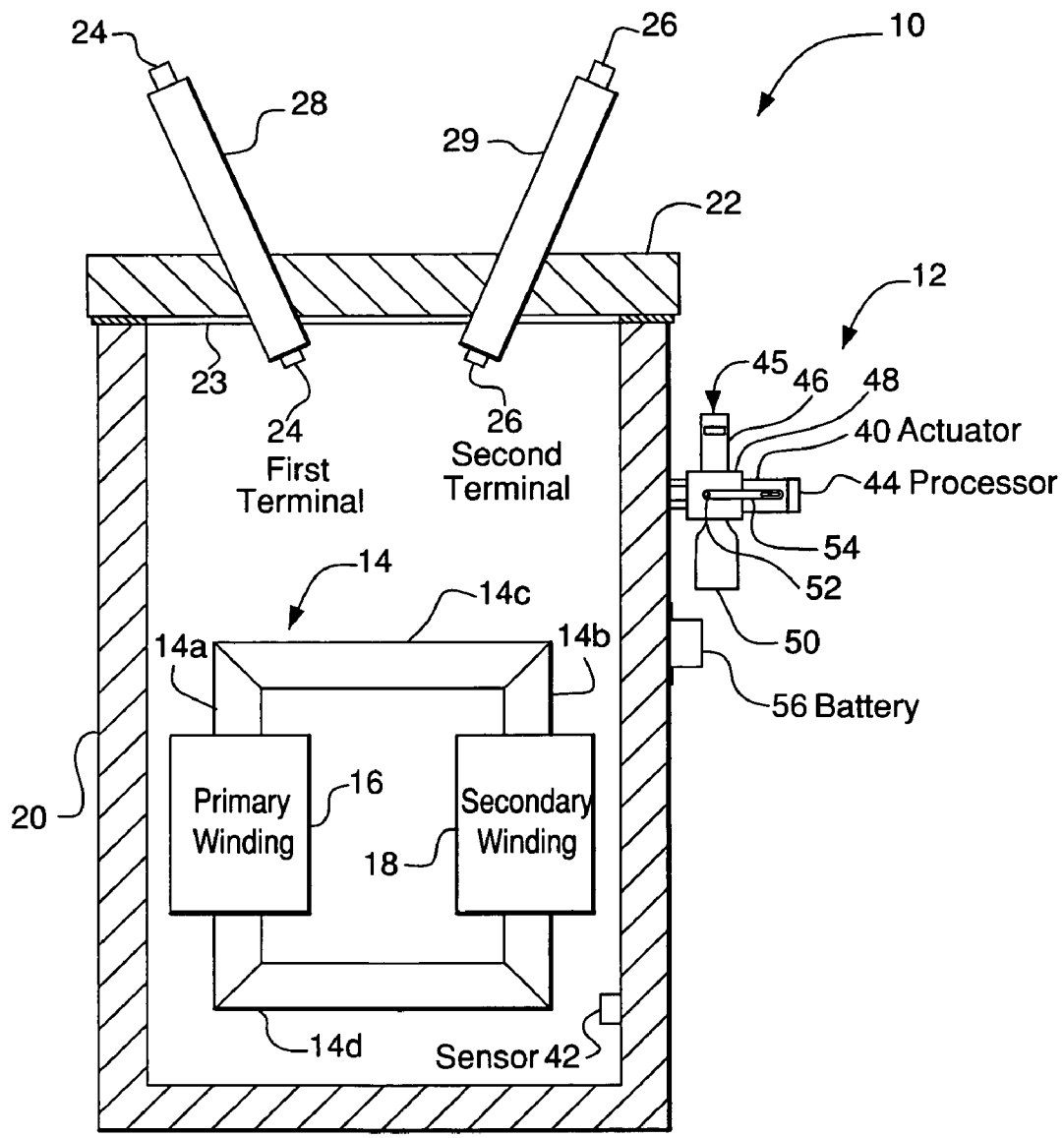
FIG. 1 is a diagrammatic illustration of a transformer comprising a preferred embodiment of a fault-annunciating system, showing a casing and a cover of the transformer in cross section.
Figure 2:
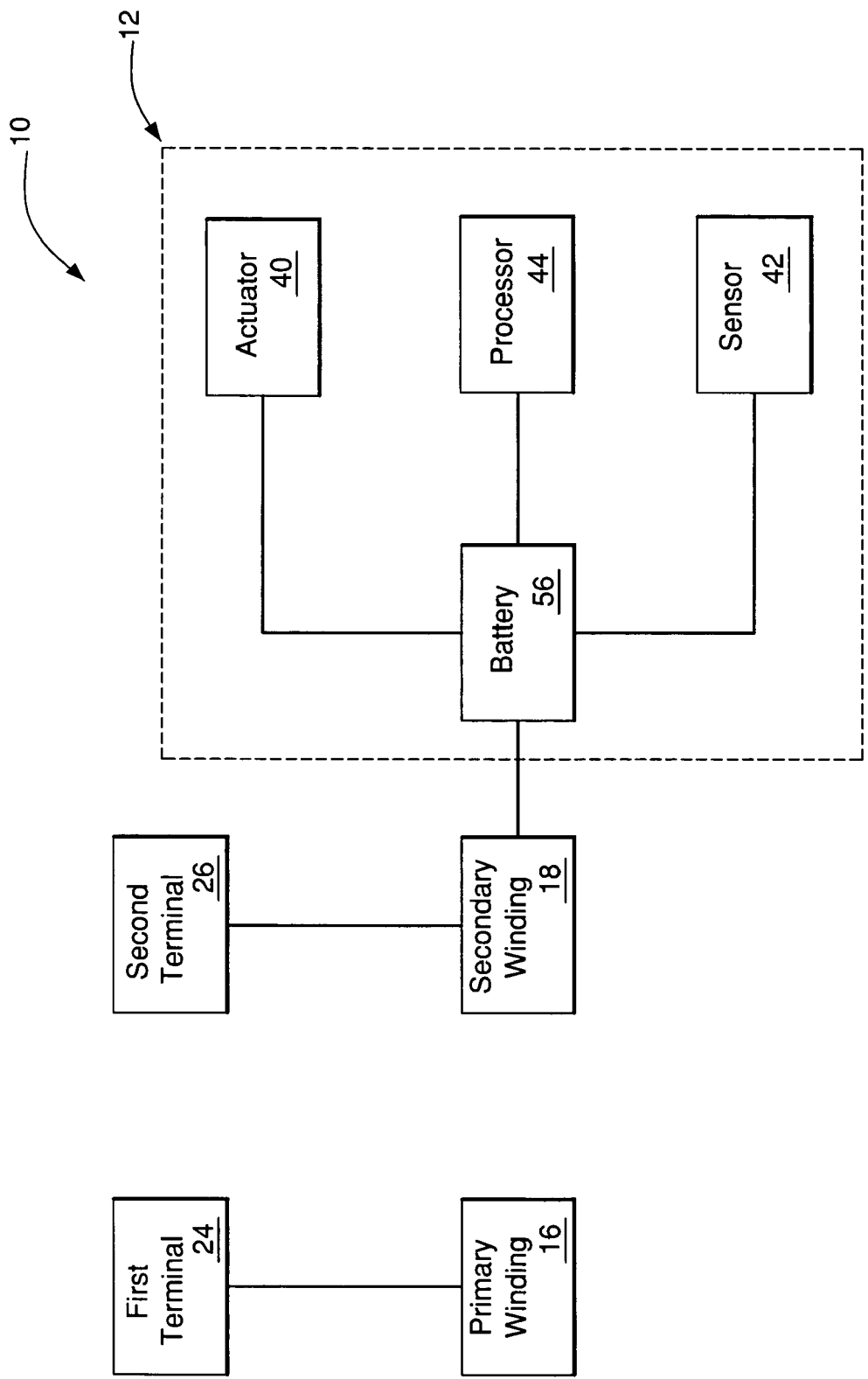
FIG. 2 is a block diagram of the transformer shown in FIG. 1.

FIGS. 1 and 2 depict a distribution transformer 10 comprising a preferred embodiment of a fault-annunciating system 12. The transformer 10 is a single-phase, oil-filled, core-type transformer suitable for a pole-top installation. The fault-annunciating system 12 is described herein in connection with the transformer 10 for exemplary purposes only. The fault-annunciating system 12 can be used with virtually any type of transformer, including power transformers, dry, multi-phase, and shell-type transformers, and transformers suitable for mounting on pads at electrical substations.

The fault-annunciating system 12, as explained below, generates an audible signal (sound) in response to the occurrence of a fault within the transformer 10. The audible signal can alert a repair crew in the vicinity of the transformer 10 to the presence of a fault in that particular transformer 10.

The transformer 10 comprises a laminated core 14 (see FIG. 1). The core 14 comprises a first winding leg 14a, a second winding leg 14b, an upper yoke 14c, and a lower yoke 14d. Opposing ends of each of the upper and lower yokes 14c, 14d are secured to the first and second winding legs 14a, 14b as shown in FIG. 1.

The transformer 10 further comprises a primary winding 16 positioned around the first winding leg 14a, and a secondary winding 18 positioned around the second winding leg 14b. It should be noted that the primary and secondary windings 16, 18 can be concentrically disposed around a single winding leg in alternative embodiments of the transformer 10.

The transformer 10 also comprises a casing 20, and a cover 22 that mates with and covers the casing 20. The core 14 and the windings 16, 18 are housed within the casing 20. The core 14 and the primary and secondary windings 16, 18 are immersed in oil within the casing 20. The oil helps to cool and electrically insulate the core 14 and the primary and secondary windings 16, 18. (The oil is not shown in the figures, for clarity.)

A gasket 23 is positioned between the casing 20 and the cover 22 so that a substantially airtight seal is formed between the casing 20 and the cover 22. The casing 20, cover 22, and the gasket 23 thus isolate the core 14 and the primary and secondary windings 16, 18 from the environment around the transformer 10.

The transformer 10 further comprises a first terminal 24 electrically coupled to the primary winding 16, and a second terminal 26 electrically coupled to the secondary winding 18. (The electrical connections between the various components of the transformer 10 are depicted in FIG. 2. The electrical connections are not depicted in FIG. 1, for clarity.)

The first and second terminals 24, 26 each extend through respective penetrations formed in the cover 22. The first terminal 24 is electrically isolated from the cover 22 by a first bushing 28. The second terminal 26 is electrically isolated from the cover 22 by a second bushing 29.

The primary winding 16 is electrically coupled to an alternating-current power source, such as a substation of a power grid (not shown), by way of the first terminal 24. The secondary winding 18 is electrically coupled to a load, such as an electrical system of a residential dwelling (also not shown), by way of the second terminal 26.

The primary and secondary windings 16, 18 are inductively coupled via the core 14 when the primary winding 16 is energized by the power source. In particular, the alternating voltage across the primary winding 16 produces an alternating magnetic flux in the core 14. The alternating magnetic flux induces an alternating voltage across the secondary winding 18 (and the load connected thereto).

The voltage across each of the primary and secondary windings 16, 18 is proportional to the number of turns in the respective primary and secondary windings 16, 18. The current in each of the primary and secondary windings 16, 18 is inversely proportional to the number of turns in the respective primary and secondary windings 16, 18.

Further details of the transformer 10 (other than the following details of the fault-annunciating system 12) are not necessary to an understanding of the invention, and therefore are not included herein. Moreover, it should be noted that the above-described details of the transformer 10 are presented for illustrative purposes only. The fault-annunciating system 12 can be used in conjunction with transformers of virtually any configuration.

The fault-annunciating system 12 comprises an actuator 40, a temperature sensor 42, a processor 44, e.g., a microprocessor, and an audible signaling device 45. The fault annunciating system 12, as discussed below, generates an audible signal in response to the occurrence of a fault in the transformer 10. The audible signal can be used by a repair crew from the utility company to locate the faulty transformer 10 so that corrective action can be initiated.

The fault-annunciating system 12 preferably comprises a rechargeable battery 56 for powering the various electrical components of the fault-annunciating system 12. The battery 56 is preferably recharged using the secondary winding 18 as a source of power.

The audible signaling device 45 is preferably mounted on the outer surface of the casing 20, as shown in FIG. 1. (The audible signaling device 45 can be mounted on an outer surface of the cover 22 in alternative embodiments.)

The audible signaling device 45 can comprise, for example, a whistle 46, a pressure-regulating valve 48, and a canister 50. The canister 50 holds a pressurized fluid, e.g., gaseous nitrogen. The canister 50 fluidly communicates with the whistle 46 on a selective basis by way of the pressure-regulating valve 48. More particularly, the pressure-regulating valve 48 permits the pressurized fluid to flow from the canister 50 to the whistle 46 when the pressure-regulating valve 48 is activated. The resulting flow of fluid through the whistle 46 causes the whistle 46 to generate an audible signal. The significance of this feature is discussed below.

The pressure-regulating valve 48 maintains the pressure of the fluid exiting the canister 50 at a substantially constant level. Hence, the pressure of the fluid entering the whistle 46 (and the resulting volume of the whistle 46) can remain substantially constant.

Virtually any type of conventional pressure-regulating valve capable of providing the pressure and flow-rate required by the whistle 46 can be used as the pressure-regulating valve 48. For example, the pressure-regulating valve 48 can be of the self-regulating type that operates based on pre-set spring tension therein. Alternatively, the pressure-regulating valve 48 can be actuated by a separate valve controller (not shown).

The temperature sensor 42 measures the temperature of the oil within the transformer 10. The temperature sensor 42 can be mounted on an inner surface of the casing 20, as shown in FIG. 1. Virtually any type of conventional temperature sensor can be use as the temperature sensor 42 including, for example, a thermocouple, thermistor, resistance temperature detector, etc. The temperature sensor 42 is electrically coupled to the processor 44, and thus provides the processor 44 with an input corresponding the oil temperature within the transformer 10.

The actuator 40 activates the pressure-regulating valve 48. More particularly, the actuator 40 is mechanically coupled to the pressure-regulating valve 48 so that the actuator 40 can actuate an on-off feature on the pressure-regulating valve 48. For example, the actuator 40 can be mechanically coupled to a switch 52 of the pressure-regulating valve 48 by a linkage 54 (see FIG. 1). Movement of the linkage 54 by the actuator 40 causes the switch 52 to move between an "off" and an "on" position. Movement of the switch 52 to the "on" position activates the pressure-regulating valve 48. The pressure-regulating valve 48, once activated, permits pressurized fluid to flow from the canister 50 to the whistle 46 as described above.

The actuator 40 is electrically coupled to the processor 44, and is responsive to commands from the processor 44. More specifically, the processor 44 can issue commands to the actuator 40 that cause the actuator 40 to move the switch 52 between its on and off positions. The processor 44 can thereby control whether the pressurized air from the canister flows to the whistle 46.

Virtually any type of conventional actuator capable of responding to the commands of the processor 44 in the above-described manner can be used as the actuator 40.

For example, a conventional electro-mechanical actuator can be used as the actuator 40. The electromechanical actuator can comprise a shaft mechanically coupled to the linkage 54 and having a magnetic sleeve attached to an outer surface thereof (not shown). The magnetic sleeve can be positioned within a coil (also not shown). Energization of the coil in response to a commands from the processor 44 can generate a magnetic field that causes the magnetic sleeve (and the attached shaft) to move in relation to the coil. Movement of the shaft causes a corresponding movement in the linkage 54 that, in turn, moves the switch 60 between its "off" and "on" positions.

Moreover, the actuator 40 and processor 44 can be used to actively control the pressure-regulating valve 48 in applications where the pressure-regulating valve 48 is not of the self-regulating type.

The processor 44 monitors the oil temperature within the transformer 10, as noted previously. The processor 44 commands the actuator 40 to move the switch 60 to its "on" position when the oil temperature reaches, i.e., increases to, a predetermined value. Moving the switch to its "on" position, as discussed above, initiates the flow of pressurized air to the whistle 46 and thereby causes the whistle 46 to produce an audible signal.

A substantial increase in the oil temperature within a transformer such as the transformer 10 is usually indicative of a fault condition. The fault-annunciation system 12 reacts to such increases by issuing an audible signal. The audible signal issued by the fault-annunciation system 12 can thus indicate that a fault has occurred within the transformer 10.

It should be noted that the particular operating parameter or parameters used as an indication of a fault in the transformer 10 is application dependent. Operating parameters other than oil temperature can be used as a basis for activating the fault-annunciation system 12 in alternative embodiments. For example, alternative embodiments of the fault-annunciation system 12 can be responsive to pressure. In particular, a conventional pneumatic pressure sensor (not shown) can be used in lieu of the temperature sensor 42. The processor 44 can be programmed to monitor the air pressure within the transformer 10. The processor 44 can command the actuator 40 to move the switch 60 to its "on" position when the pressure reaches a predetermined value, thereby initiating the flow of pressurized air to the whistle 46 and causing the whistle 46 to produce an audible signal.

A repair crew from the utility company can use the sound of the whistle 46 to identify a particular transformer that has experienced a fault. More particularly, the repair crew can be sent to the general vicinity in which a power outage or other abnormality has occurred due a faulty transformer such as the transformer 10. The sound of the whistle 46 can lead the repair crew to the faulty transformer 10, or at the very least, can draw the attention of the repair crew to the faulty transformer 10 as the repair crew drives by the transformer 10.

The repair crew, once identifying the faulty transformer 10, can repair the transformer 10 or otherwise correct the condition that lead to the occurrence of the fault. Following the repair of the transformer 10, the fault-annunciating system 12 can be rendered ready for further use by replacing the discharged canister 50 with a fully-charged canister 50.

The canister 50 can be sized to hold a sufficient amount of fluid to activate the whistle 46 for a predetermined period of time. The predetermined period of time, or activation period, should be sufficient to permit the repair crew to reach the transformer 10 following the occurrence of a fault. The response time of the repair crew is application-dependent, and can vary with factors such as the location of the transformer in relation to the base of operations of the repair crew, the number of transformers located along the route followed by the repair crew, etc. A specific value for the activation period of the whistle 46 therefore is not specified herein.

The volume, i.e., the sound intensity or dB level, of the whistle 46 should be sufficient to allow a repair crew to hear the whistle 46 when the repair crew is in the vicinity the transformer, or at the very least, as the repair crew drives by the pole on which the transformer 10 is mounted.

The optimal volume for the whistle 46 is application dependent. For example, where the transformer 10 is to be used in a residential location, it may be desirable for the whistle 46 to have a relatively low volume to avoid disturbing residents located near the transformer 10. Conversely, it may be desirable for the whistle to have a relatively high volume where the transformer 10 is to be used in remote or sparsely-populated locations, thus making it easier for the repair crew to locate the transformer 10 once a fault occurs therein.

The whistle 46 can be chosen so as to make virtually any tone that can be recognized by a repair crew as an indication that the fault-annunciation system 12 of a particular transformer 10 has been activated.

The audible indication generated by the fault-annunciating system 12 can potentially eliminate the need for a repair crew to visually scan multiple transformers for a fault indication. Eliminating the need for a visual scan can eliminate or reduce muscle strain or fatigue on the repair crew caused by the need to repeatedly look upward, at a relatively steep angle, to visually acquire a fault indication from a pole-mounted transformer. Moreover, eliminating the need for a visual scan can reduce the potential for the driver of the vehicle carrying the repair crew to become distracted while attempting to visually acquire the fault indication.

The audible fault indication provided by the fault-annunciating system 12 can, in general, be more readily detected at night and under adverse weather conditions, e.g., fog or heavy rain, than a visual fault indication. Moreover, the audible fault indication can potentially be detected when the transformer 10 is not in sight of the repair crew. Thus, the audible fault indication can potentially be detected at a greater distance from the transformer 10 than a visual indication. Also, detection of the audible fault indication, in general, does not substantially depend on the perspective of the repair crew in relation to the transformer.

It is to be understood that even though numerous characteristics of the present invention have been set forth in the foregoing description, the disclosure is illustrative only and changes may be made in detail within the principles of the invention to the full extent indicated by the broad general meaning of the terms in which the appended claims are expressed.

For example, alternative embodiments can comprise a mechanical temperature or pressure sensor and a mechanical actuator. An example of such a system is depicted in FIGS.

Figure 3:
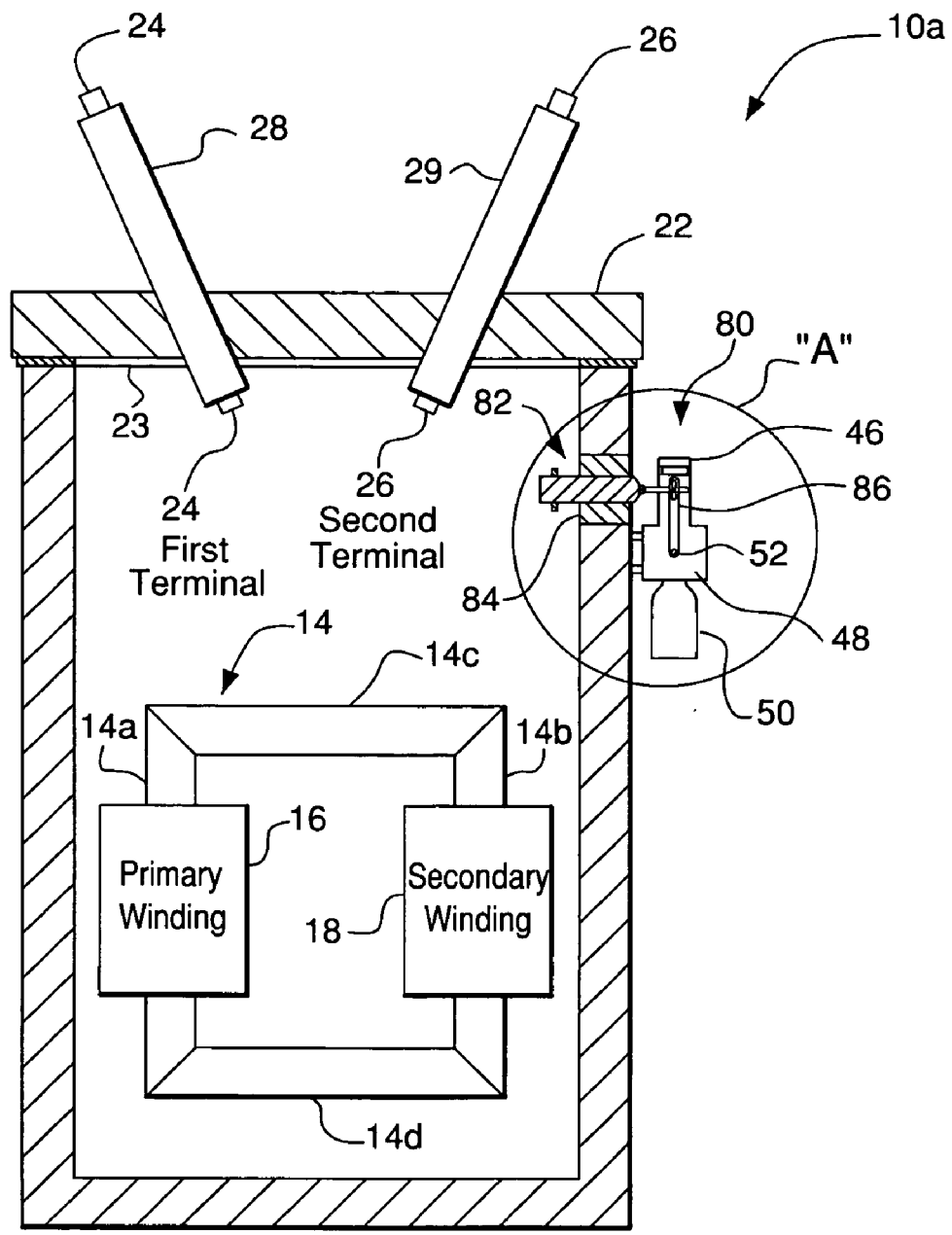
FIG. 3 is a diagrammatic illustration of an alternative embodiment of the transformer shown in FIG. 1, showing a casing and a cover of the transformer in cross section.
Figure 4A:
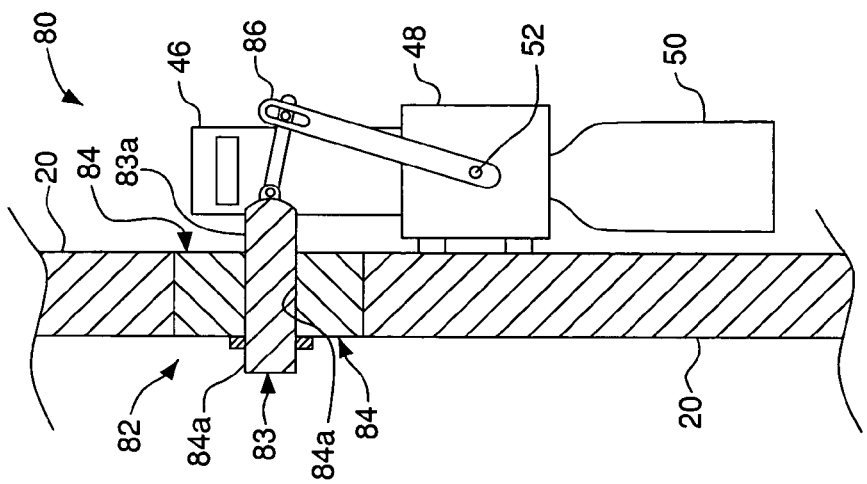
FIG. 4A is a magnified view of the area designated "A" in FIG. 3, before activation of a fault-annunciation system of the transformer.
Figure 4B:
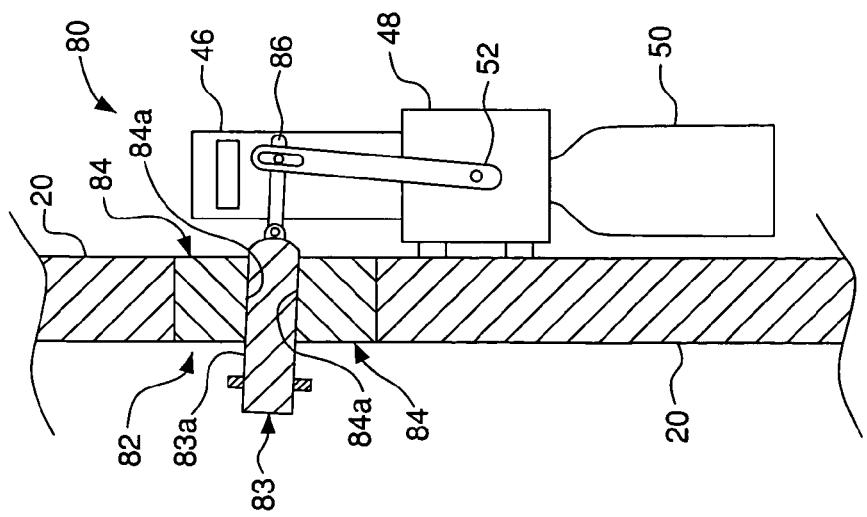
FIG. 4B is a magnified view of the area designated "A" in FIG. 3, after activation of the fault-annunciation system.

3–4B. FIGS. 3–4B depict a transformer 10a comprising a fault-annunciating system 80. The fault-annunciating system 80 comprises a mechanical pressure sensor/actuator 82. (Components common the transformer 10a and the transformer 10 are denoted by common reference numerals in the figures.)

The pressure sensor/actuator 82 comprises a rod 83 and a housing 84. The housing 84 is mounted on, and extends though, the casing 20. (The fault annunciating system 80 can be mounted on the cover 22 in the alternative.) The housing 84 has a surface 84a that defines a through hole. The through hole receives the rod 83 so that a portion of a circumferentially-extending outer surface 83a of the rod 83 contacts the surface 84a.

The rod 83 moves from a first (retracted) position (FIGS. 3 and 4A) to a second (extended) position (FIG. 4B) in response to an overpressure condition within the casing 20. The selective movement of the rod 83 can be achieved, for example, by selecting appropriate values for the coefficients of friction of the surfaces 83a, 84a.

The rod 83 is mechanically coupled to the switch 52 of the pressure-regulating valve 48 by a linkage 86. Movement of the rod 83 from its retracted to its extended position causes a corresponding movement of the linkage 86. Movement of the linkage 86, in turn, moves the switch 52 from its "off" to its "on" position, thereby activating the pressure-regulating valve 48 and initiating flow of the pressurized fluid from the canister 50 to the whistle 46.

Virtually any type of audible signaling device capable of generating a sound at the required volume and for the required duration can be used in lieu of the audible signaling device 45 in alternative embodiments.

Figure 5:
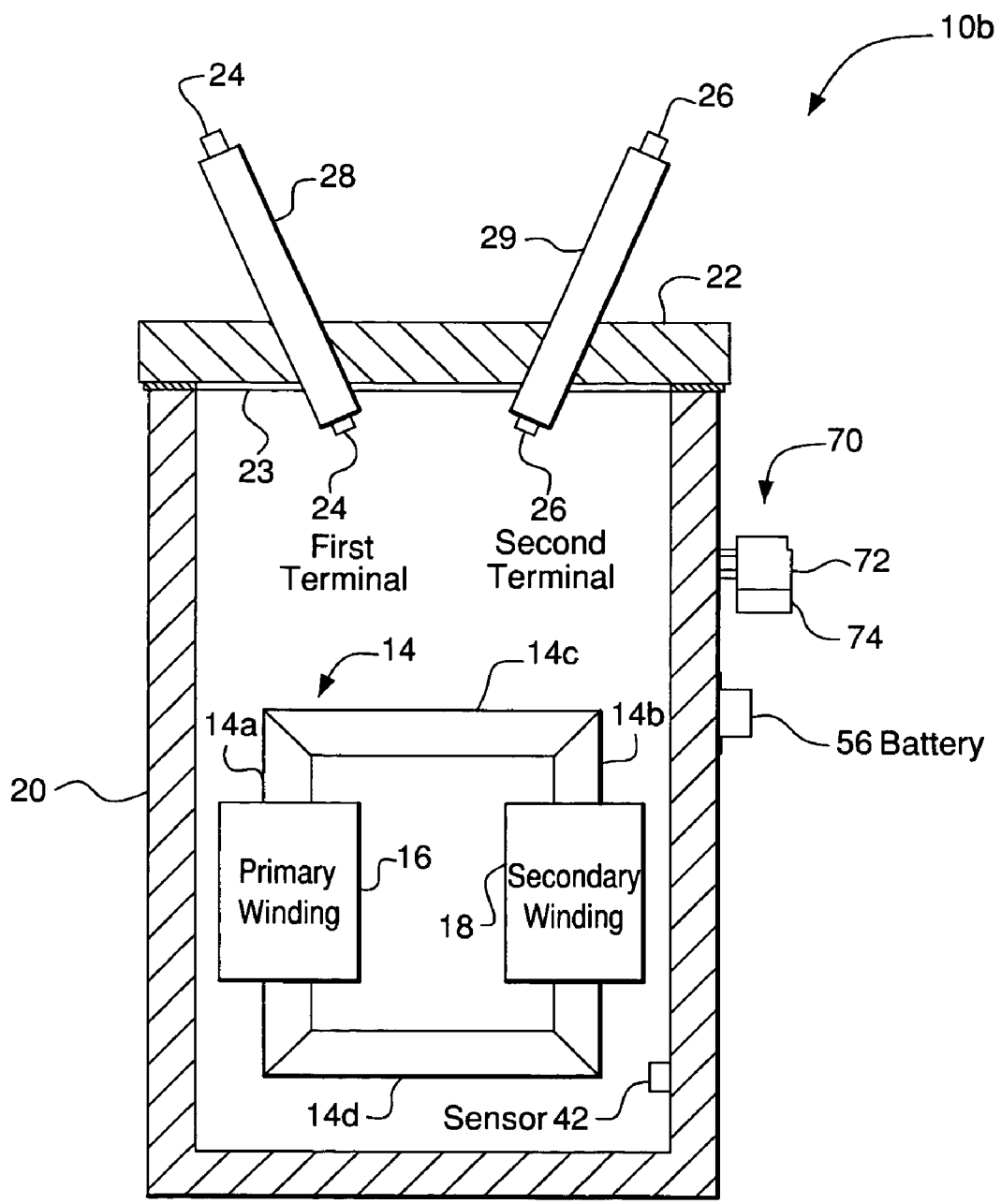
FIG. 5 is a diagrammatic illustration of another alternative embodiment of the transformer shown in FIG. 1, showing a casing and a cover of the transformer in cross section.

For example, FIG. 5 depicts a transformer 10b comprising a fault-annunciating system 70. (Components common the transformer 10b and the transformer 10 are denoted by common reference numerals in the figures.) The fault-annunciating system 70 comprises an electronic audible signaling device 72 such as an electronic alarm, and an electronic actuator 74 comprising a processor. The actuator 74 generates and sends an electrical signal to the audible signaling device 72 when the oil temperature in the transformer 10b, as measured by the temperature sensor 42, reaches a predetermined value. (Other alternative embodiments can use the electronic audible signaling device 72 and the electronic actuator 74 in conjunction with a pressure sensor (not shown)).

Other alternative embodiments can include an electronic actuator such as the actuator 74 and a mechanical audible signaling device such as the audible signaling device 45. Further alternative embodiments can include an actuator integrated into the audible signaling device.

What is claimed is:

1. A transformer, comprising:
   a core;
   a primary and a secondary winding positioned on the core so that the primary and secondary windings are inductively coupled when the primary winding is energized;
   a sensor for measuring an operating parameter of the transformer;
   an audible signaling device comprising a whistle, a pressure regulator, and a canister for holding a pressurized fluid, the canister being in fluid communication with the whistle on a selective basis by way of the pressure regulator; and
   an actuator for activating the audible signaling device when the operating parameter reaches a predetermined value.

2. The transformer of claim 1, wherein the operating parameter is an oil temperature of the transformer and the sensor is a temperature sensor.

3. The transformer of claim 2, further comprising a battery for energizing the actuator and the temperature sensor.

4. The transformer of claim 1, wherein the pressure regulator permits the pressurized fluid to flow from the canister to the whistle when the audible signaling device is activated.

5. The transformer of claim 4, wherein the pressure regulator maintains a pressure of the pressurized fluid reaching the whistle at a substantially constant level.

6. The transformer of claim 1, wherein the actuator is an electro-mechanical actuator.

7. The transformer of claim 1, further comprising a processor electrically coupled to the sensor and the actuator, the processor generating an output that causes the actuator to activate the audible signaling device when the operating parameter reaches the predetermined value.

8. The transformer of claim 1, further comprising a casing for housing the core and the primary and secondary windings, and a cover for the casing, wherein the audible signaling device is mounted on an outer surface of one of the casing and the cover.

9. The transformer of claim 8, wherein the sensor is mounted on an inner surface of the casing.

10. The transformer of claim 8, wherein the sensor and the actuator comprise a mechanical sensor/actuator.

11. The transformer of claim 10, wherein the sensor/actuator comprises a rod, and a housing mounted on and extending through the one of the casing and the cover, the housing has a through hole formed therein for receiving the rod, the rod is movable between a retracted position and an extended position in relation to the housing in response to an overpressure condition within the casing, and movement of the rod from the retracted position to the extended position activates the audible signaling device.

12. The transformer of claim 11, further comprising a linkage mechanically coupled to the rod and the audible signaling device, wherein movement of the rod from the retracted position to the extended position causes the linkage to move a switch on the audible signaling device thereby activating the audible signaling device.

13. The transformer of claim 1, further comprising a linkage mechanically coupled to the actuator and the audible signaling device, wherein the actuator causes the linkage to move a switch on the audible signaling device when the operating parameter reaches the predetermined value thereby activating the audible signaling device.

14. The transformer of claim 1, wherein the core comprises a first and a second winding leg and a first and a second yoke, the first yoke is fixedly coupled to respective first ends of the first and second winding legs, the second yoke is fixedly coupled to respective second ends of the first and second winding legs, the first winding is positioned on the first winding leg, and the second winding is positioned on the second winding leg.

15. The transformer of claim 1, wherein the audible signaling device comprises an electronic alarm.

16. The transformer of claim 15, wherein the actuator comprises a processor for activating the electronic alarm when the operating parameter reaches the predetermined value.

17. The transformer of claim 1, further comprising a first terminal electrically coupled to the primary winding and a second terminal electrically coupled to the secondary winding.

18. A transformer comprising a core, a primary and a secondary winding positioned on the core, and an audible signaling device responsive to the occurrence of a fault in the transformer, the audible signaling device comprising a whistle, a pressure regulator, and a canister for holding a pressurized fluid, wherein the canister is in fluid communication with the whistle on a selective basis by way of the pressure regulator.

19. The transformer of claim 18, further comprising an actuator for activating the audible signaling device.

20. The transformer of claim 18, further comprising a sensor for measuring an operating parameter of the transformer.

21. The transformer of claim 18, further comprising a casing for housing the core and the primary and secondary windings, and a cover for the casing, wherein the audible signaling device is mounted on an outer surface of one of the casing and the cover.

22. The transformer of claim 21, further comprising a mechanical sensor/actuator comprising a rod, and a housing mounted on and extending through the one of the casing and the cover, the housing has a through hole formed therein for receiving the rod, the rod is movable between a retracted position and an extended position in relation to the housing in response to an overpressure condition within the casing, and movement of the rod from the retracted position to the extended position activates the audible signaling device.

23. The transformer of claim 22, further comprising a linkage mechanically coupled to the rod and the audible signaling device, wherein movement of the rod from the retracted position to the extended position causes the linkage to move a switch on the audible signaling device thereby activating the audible signaling device.

24. A transformer, comprising:
a core;
a primary winding positioned around a first winding leg of the core;
a secondary winding positioned around one of the first winding leg and a second winding leg of the core;
a casing for housing the core and the primary and secondary windings;
a cover for the casing;
an audible signaling device mounted on one of the casing and the cover and comprising a whistle, a pressure regulator, and a canister for holding a pressurized fluid;
a sensor for measuring an operating parameter of the transformer; and
an actuator for causing the pressure regulator to permit the pressurized fluid to flow from the canister to the whistle when the operating parameter reaches a predetermined value.

25. The transformer of claim 24, wherein the sensor and the actuator comprise a mechanical sensor/actuator comprising a rod, and a housing mounted on and extending through the one of the casing and the cover, the housing has a through hole formed therein for receiving the rod, the rod is movable between a retracted position and an extended position in relation to the housing in response to an overpressure condition within the casing, and movement of the rod from the retracted position to the extended position activates the audible signaling device.

26. The transformer of claim 25, further comprising a linkage mechanically coupled to the rod and the audible signaling device, wherein movement of the rod from the retracted position to the extended position causes the linkage to move a switch on the pressure regulator thereby activating the whistle.

27. A transformer, comprising:
a core;
a primary and a secondary winding positioned on the core so that the primary and secondary windings are inductively coupled when the primary winding is energized;
a casing for housing the core and the primary and secondary windings;
a cover for the casing;
an audible signaling device mounted on an outer surface of one of the casing and the cover; and
a mechanical sensor/actuator for measuring an operating parameter of the transformer and activating the audible signaling device when the operating parameter reaches a predetermined value, wherein the mechanical sensor/actuator comprises a rod, and a housing mounted on and extending through the one of the casing and the cover, the housing has a through hole formed therein for receiving the rod, the rod is movable between a retracted position and an extended position in relation to the housing in response to an overpressure condition within the casing, and movement of the rod from the retracted position to the extended position activates the audible signaling device.

28. A transformer comprising:
a core;
a primary and a secondary winding positioned on the core;
a casing for housing the core and the primary and secondary windings;
a cover for the casing;
an audible signaling device responsive to the occurrence of a fault in the transformer and mounted on an outer surface of one of the casing and the cover; and
a mechanical sensor/actuator comprising a rod, and a housing mounted on and extending through the one of the casing and the cover, wherein the housing has a through hole formed therein for receiving the rod, the rod is movable between a retracted position and an extended position in relation to the housing in response to an overpressure condition within the casing, and movement of the rod from the retracted position to the extended position activates the audible signaling device.

* * * * *

UNITED STATES PATENT AND TRADEMARK OFFICE
CERTIFICATE OF CORRECTION

PATENT NO. : 6,949,934 B1 Page 1 of 1
DATED : September 27, 2005
INVENTOR(S) : Tri D. Vu et al.

It is certified that error appears in the above-identified patent and that said Letters Patent is hereby corrected as shown below:

Title page,
Item [54], Title, "FAULT-ANNUCIATING" should read
-- FAULT-ANNUNCIATING --.

Signed and Sealed this

Thirteenth Day of December, 2005

JON W. DUDAS
*Director of the United States Patent and Trademark Office*